United States Patent [19]

Foster

[11] Patent Number: 4,875,152

[45] Date of Patent: Oct. 17, 1989

[54] ELECTRICAL TAP SWITCH

[76] Inventors: William H. Foster, Box 694, Kinistino, Saskatchewan S0J J-1H0, Canada

[21] Appl. No.: 169,013

[22] Filed: Mar. 16, 1988

[51] Int. Cl.$^4$ .............................................. H02M 1/00
[52] U.S. Cl. ..................................... 363/146; 340/656; 340/664; 439/490
[58] Field of Search ............................... 363/146, 147; 178/50.52, 50.53; 439/488, 489, 490; 340/656, 664

[56] References Cited

U.S. PATENT DOCUMENTS

| | | | |
|---|---|---|---|
| 1,935,771 | 11/1933 | Feurstein et al. | 340/656 |
| 2,696,607 | 12/1954 | Witkin | 340/656 |
| 3,530,337 | 9/1970 | Moore | 340/656 |
| 3,924,914 | 12/1975 | Banner | 340/656 |
| 4,404,461 | 9/1983 | Sitek et al. | 323/319 |
| 4,659,161 | 4/1987 | Holcomb | 439/490 |

Primary Examiner—Peter S. Wong
Attorney, Agent, or Firm—Richard L. Miller

[57] ABSTRACT

An electrical tap switch is provided that allows a user to control two power outlets. In one embodiment the tap switch is used in-line between one extension cord and two additional ones. In another embodiment the tap switch is plugged directly into a wall receptacle and is permanently secured using a screw mechanism. An indicator is used to display the on-off status of the tap switch. A bar graph current indicator is provided that displays the total current drawn by all loads.

4 Claims, 1 Drawing Sheet

ELECTRICAL TAP SWITCH

BACKGROUND OF THE INVENTION

The instant invention relates generally to the field of power controlling devices, and, more specifically, to combination power outlets and switches.

At the present state of the art, a number of electrical applications are not provided with power switches or power indicators. The solution up to now has been to either drill holes in the appliance to install a switch, or to cut the line cord to the appliance to insert a line cord mounted switch. Both of these solution require modification of the appliance which may void the warranty or create a safety hazard due the inexperience of the switch/indicator installer or the incorrect selection of parts. In addition, there is a natural tendency to power a number of appliances from one outlet. However, there is typically no way of knowing when the current carrying capability of the power line is being exceeded. The only indication is the blowing of fuses, tripping of circuit breakers, or the odor of smoke.

A number of inventions have been posited which in some way address these problems. C. Smith (U.S. Pat. No. 2,075,364) provides a convenience light fixture, but this is a self-contained unit and does not permit external switching of circuits. L. Searcy (U.S. Pat. No. 2,851,550) provides a remote control switch for electrical appliances, and H. Friedman (U.S. Pat. No. 2,137,569) provides a plug-in switch, however, neither give any indication of current consumption.

SUMMARY OF THE INVENTION

It is, therefore, a primary object of the instant invention is to provide an electrical tap switch that can be used in-line between one extension cord and two additional extension cords.

A further object is to provide an electrical tap switch that can be plugged directly into a wall outlet yet protrude as little as possible, and can be permanently secured to the outlet using the screw mechanism provided.

A still further object is to provide an electrical tap switch with an indicator light that glows when the tap switch is switched on.

A yet further object is to provide an electrical tap switch with a bar graph indicator that displays the total current to warn against overload.

Another object is to provide an electrical tap switch that is simple and inexpensive to manufacture, and easy and safe to use.

Further objects of the invention will appear as the description proceeds.

To the accomplishment of the above and related objects, this invention may be embodied in the form illustrated in the accompanying drawings, attention being called to the fact, however, that the drawings are illustrative only and that changes may be made in the specific construction illustrated and described within the scope of the appended claims.

BRIEF DESCRIPTION OF THE DRAWING FIGURES

The figures on the drawings are briefly described as follows.

DETAILED DESCRIPTION OF THE PREFERRED EMBODIMENTS

Figure 1:
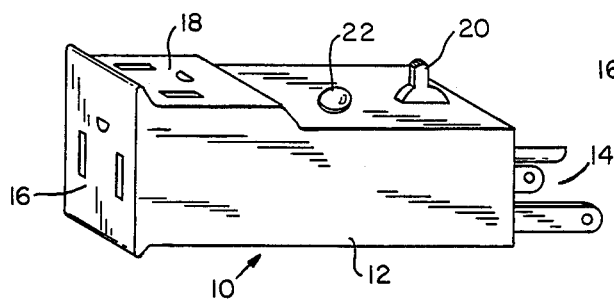
FIG. 1 is a perspective view of an in-line embodiment of the invention.
Figure 2:
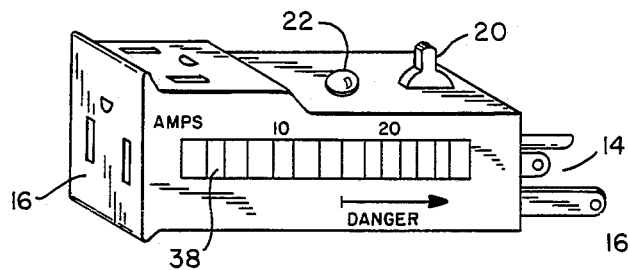
FIG. 2 is a perspective view of an embodiment similar to FIG. 1 with the addition of a bar graph current indicator.

The in-line embodiments of the invention are illustrated in FIGS. 1 and 2. The wall-plate mounted embodiments of the invention are illustrated in FIGS. 3 and 4.

In FIG. 1 the generally rectilinear shell 12 is made of a rigid or semi-rigid material. By locating plug 14 at one end of the shell, and outlet 16 at the opposite end, the outlet 18 and switch 20 and indicator lamp 22 on top of the shell, the electrical tap switch 10 is ideal for in line use between one extension cord and two additional ones.

Figure 5:
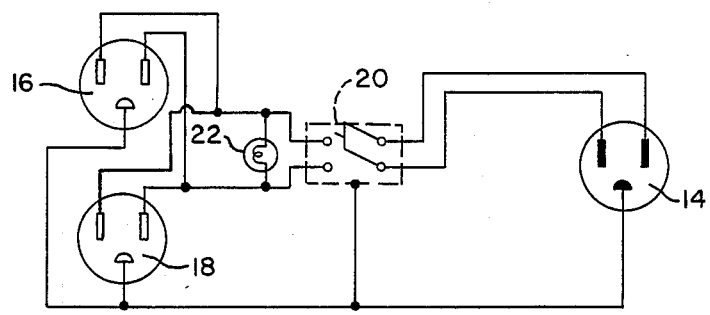
FIG. 5 is an electrical schematic diagram of the embodiments illustrated in FIGS. 1 and 3.

The electrical configuration of the in-line embodiment 10 is illustrated in FIG. 5. Note that a switch 20 is double pole single throw, and that the indicator lamp 22 is connected in parallel with both outlet 16 and outlet 18.

Figure 3:
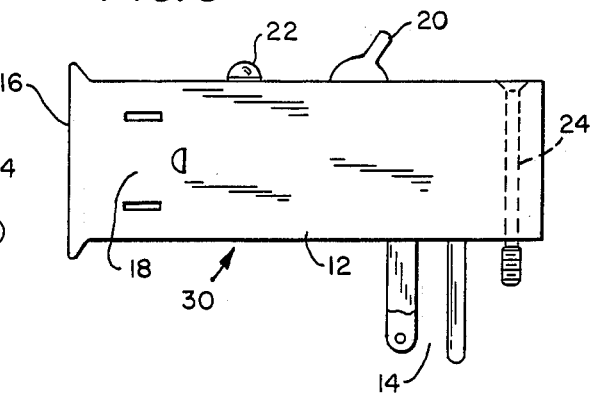
FIG. 3 is a front plan view of an alternative embodiment of the invention for installation into a outlet plate and with securing means thereto.
Figure 4:
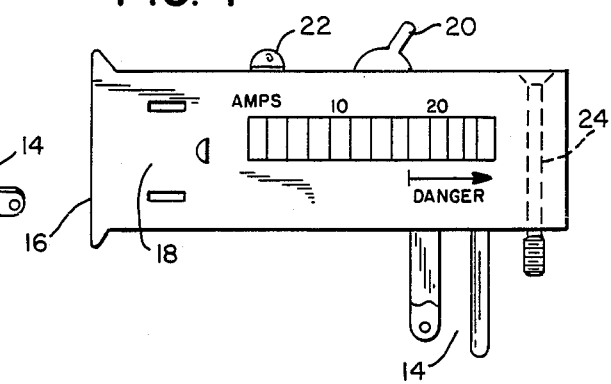
FIG. 4 is a front view of an embodiment similar to FIG. 3 with the addition of a bar graph current indicator.

In FIG. 3, by locating plug 14 on the bottom of the shell, outlet 16 on the end of the shell, outlet 18 on the front of the shell, and switch 20 and indicator lamp 22 on top of the shell, this configuration is ideal for plugging the electrical tap switch 30 directly into a wall receptacle, since it does not protrude far from the wall. In addition a machine screw 24 is inserted into a recessed aperture in the top of shell 12, protrudes through an aperture in the bottom of the shell, and then into the threaded aperture typically used in a wall outlet to secure the outlet plate. This screw 24 fixes tap switch 30 permanently to the wall plate. The electrical configuration of wall mounted electrical tap switch 30 is also illustrated in FIG. 5.

Figure 6:
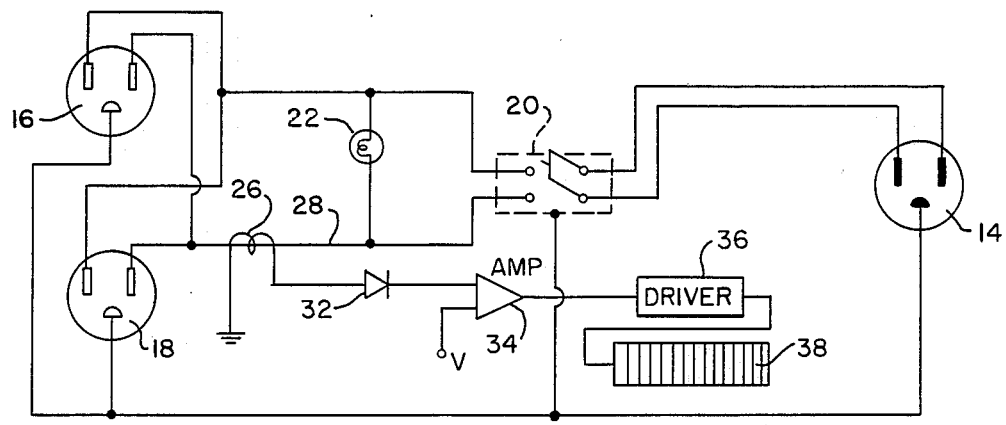
FIG. 6 is an electrical schematic diagram of the embodiments illustrated in FIGS. 2 and 4.

FIGS. 2 and 3 illustrate embodiments as above except that a current utilization indicator has been added. The new circuit configuration is illustrated in FIG. 6. A current transformer is created by wrapping conductor 26 around common current carrying conductor 28. The induced ac voltage, which is proportional to the total current delivered to outlets 16 and 18, is rectified from ac to dc by diode 32. The rectified voltage is amplified by amplifier 34. The amplified voltage is input to driver 36. Driver 36 processes this analog signal and converts it to digital form for bar graph display 38.

While certain novel features of this invention have been shown and described and are pointed out in the annexed claims, it will be understood that various omissions, substitutions and changes in the forms and the details of the device illustrated and in its operation can be made by those skilled in the art without departing from the spirit of the invention.

What is claimed is:

1. An electrical tap switch, comprising:
 (a) a generally rectilinear shell;
 (b) a power plug mounted directly on said shell;

(c) a first power outlet;
(d) a second power outlet connected in parallel to said first power outlet;
(e) a double pole double throw switch with switch actuator projecting upward from a top surface of said shell, wherein said switch is in series between said plug and said outlets; and,
(f) an indicator connected in parallel with both said outlets whereby closing said double pole switch energizes both said power outlets, wherein said indicator turns on when said power outlets are energized, wherein said plug projects outward from one end of said shell, said first outlet is integral to the end of said shell, and said second outlet is integral to the top of said shell and is located in close proximity to said first outlet, thereby allowing for in-line use of said electrical tap switch, wherein said indicator comprises a current transformer consisting of a conductor wrapped around a common switched current carrying conductor, a diode to rectify the current from ac to dc; an amplifier to increase the amplitude of the rectified voltage, a driver, and a bar graph display, mounted to the front of said shell and driven by said driver, such that said bar graph displays the total current delivered to said outlets.

2. An electrical tap switch, comprising:
(a) a generally rectilinear shell;
(b) a power plug mounted directly on said shell;
(c) a first power outlet;
(d) a second power outlet connected in parallel to said first power outlet;
(e) a double pole double throw switch with switch actuator projecting upward from a top surface of said shell, wherein said switch is in series between said plug and said outlets; and,
(f) an indicator connected in parallel with both said outlets whereby closing said double pole switch energizes both said power outlets, wherein said indicator turns on when said power outlets are energized, wherein said plug projects outward from one end of said shell, said first outlet is integral to the end of said shell, and said second outlet is integral to the top of said shell and is located in close proximity to said first outlet, thereby allowing for in-line use of said electrical tap switch, wherein said indicator comprises a lamp connected in parallel with both of said outlets, and said lamp is located on the top surface of said shell in close proximity to said switch; and further comprises a current transformer consisting of a conductor wrapped around a common switched current carrying conductor, a diode to rectify the current from ac to dc; an amplifier to increase the amplitude of the rectified voltage, a driver, and a bar graph display, mounted to the front of said shell and driven by said driver, such that said bar graph displays the total current delivered to said outlets.

3. An electrical tap switch, comprising:
(a) a generally rectilinear shell;
(b) a power plug mounted directly on said shell;
(c) a first power outlet;
(d) a second power outlet connected in parallel to said first power outlet;
(e) a double pole double throw switch with switch actuator projecting upward from a top surface of said shell, wherein said switch is in series between said plug and said outlets; and,
(f) an indicator connected in parallel with both said outlets whereby closing said double pole switch energizes both said power outlets, wherein said indicator turns on when said power outlets are energized, wherein said plug projects downward from the bottom of said shell, said first outlet is integral to the end of said shell, and said second outlet is integral to the front of said shell and is located in close proximity to said first outlet, thereby allowing for outlet plate mounting of said electrical tap switch, wherein said indicator comprises a current transformer consisting of a conductor wrapped around a common switched current carrying conductor, a diode to rectify the current from ac to dc; an amplifier to increase the amplitude of the rectified voltage, a driver, and a bar graph display, mounted to the front of said shell and to the right of said second outlet, and driven by said driver, such that said bar graph displays the total current delivered to said outlets.

4. An electrical tap switch, comprising:
(a) a generally rectilinear shell;
(b) a power plug mounted directly on said shell;
(c) a first power outlet;
(d) a second power outlet connected in parallel to said first power outlet;
(e) a double pole double throw switch with switch actuator projecting upward from a top surface of said shell, wherein said switch is in series between said plug and said outlets; and,
(f) an indicator connected in parallel with both said outlets whereby closing said double pole switch energizes both said power outlets, wherein said indicator turns on when said power outlets are energized, wherein said plug projects downward from the bottom of said shell, said first outlet is integral to the end of said shell, and said second outlet is integral to the front of said shell and is located in close proximity to said first outlet, thereby allowing for outlet plate mounting of said electrical tap switch, wherein said indicator comprises a lamp connected in parallel with both of said outlets, and said lamp is located on the top surface of said shell in close proximity to said switch; and further comprises a current transformer consisting of a conductor wrapped around a common switched current carrying conductor, a diode to rectify the current from ac to dc; an amplifier to increase the amplitude of the rectified voltage, a driver, and a bar graph display, mounted to the front of said shell and to the right of said second outlet, and driven by said driver, such that said bar graph displays the total current delivered to said outlets.

* * * * *